US006530046B1

United States Patent
Hasegawa et al.

(10) Patent No.: US 6,530,046 B1
(45) Date of Patent: Mar. 4, 2003

(54) CIRCUIT, SEMICONDUCTOR DEVICE AND METHOD FOR ENHANCING TEST EFFICIENCY OF FUNCTION MODULES

(75) Inventors: Eiji Hasegawa, Kanagawa-ken (JP); Yoshikatu Hatagaki, Kanagawa-ken (JP); Ayumi Ishii, Kanagawa-ken (JP); Hidekazu Saito, Kanagawa-ken (JP); Masaki Kume, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/511,189

(22) Filed: Feb. 23, 2000

(30) Foreign Application Priority Data

Feb. 24, 1999 (JP) .......................................... 11-046794

(51) Int. Cl.[7] .............................................. G11C 29/00
(52) U.S. Cl. ...................................................... 714/719
(58) Field of Search ................................ 714/719, 732, 714/736, 30; 702/117

(56) References Cited

U.S. PATENT DOCUMENTS

| | | | | |
|---|---|---|---|---|
| 5,062,109 A | * | 10/1991 | Ohshima et al. ............ 714/719 |
| 5,325,365 A | * | 6/1994 | Moor et al. .................... 714/29 |
| 5,911,039 A | * | 6/1999 | Hashizume et al. .......... 714/30 |
| 6,028,439 A | * | 2/2000 | Arkin et al. ................. 324/765 |
| 6,049,900 A | * | 4/2000 | Fournel ....................... 714/724 |
| 6,173,238 B1 | * | 1/2001 | Fujisaki ....................... 702/117 |

* cited by examiner

Primary Examiner—Albert Decady
Assistant Examiner—Shelly A Chase
(74) Attorney, Agent, or Firm—Oblon, Spivak, McClelland, Maier & Neustadt, P.C.

(57) ABSTRACT

There are provided a semiconductor device and a function module test method, capable of reducing the test time of function modules and reducing the number of test pins. This semiconductor device is formed so as to make test inputs and test outputs of a plurality of function modules having the same function respectively common, conduct tests on arbitrarily selected function modules simultaneously in parallel, and give a pass/fail decision on the semiconductor device including the function modules on the basis of results of comparison between a test result of arbitrary one function module and test results of other function modules.

20 Claims, 6 Drawing Sheets

CIRCUIT, SEMICONDUCTOR DEVICE AND METHOD FOR ENHANCING TEST EFFICIENCY OF FUNCTION MODULES

BACKGROUND OF THE INVENTION

1. Field of the Invention

The present invention relates to a circuit, semiconductor device, and method for enhancing the test efficiency of function modules. In particular, the present invention relates to a technique capable of testing a plurality of function modules included in a semiconductor device including a plurality of function modules having the same function, efficiently by using a simple configuration.

2. Description of the Background Art

As frequently seen in conventional system processors, there are many semiconductor devices each having a plurality of circuits having the same function (hereafter referred to as function modules), such as a plurality of CPUs having the same function. As methods for rationally testing a plurality of function modules of these semiconductor devices, two methods described hereafter have been used heretofore.

A first method is a method of serially testing a plurality of function modules, i.e., a method of repeating the same test as many times as the number of function modules. In the first method, the test is conducted repetitively for respective function modules. Therefore, the first method has an advantage in that external input/output pins of test input and test output can be shared regardless of the number of the function modules. Therefore, the number of external pins can be reduced. On the other hand, the first method has a disadvantage in that the test time becomes long by the number of times of repetition of the test. As the number of the function modules increases, the test time becomes longer.

A second method is a method of conducting tests of a plurality of function modules in parallel. This method has an advantage in that the overall test time is as short as the test time of one function module regardless of the number of the function modules and the test time becomes shorter than the first method. On the other hand, the second method has a disadvantage in that the number of the test input and output pins increases depending on the number of the function modules because simultaneous input and output of a plurality of the function modules are needed.

For example, in a semiconductor device including four function modules M1 to M4 having the same function as shown in FIG. 1, test inputs 1 to 4 and test outputs 1 to 4 are needed for the function modules M1 to M4, respectively. For the test inputs 1 to 4 and test outputs 1 to 4, test input and output pins are needed. In the case where the test time required to test respective function modules is short and the number of input and output pins is small, therefore, a very great problem is not posed in this method. In the case where a large number of function modules having a complicated function are mounted, however, the test time and the number of input and output pins which are needed become enormous, and a great problem is posed.

As heretofore described, the conventional method of testing a plurality of function modules having the same function included in a semiconductor device causes an inconvenience that the number of input and output pins for test is small but the test time becomes long, or the test time becomes short but the number of input and output pins for test increases. It has been impossible to satisfy only advantages of both methods while avoiding disadvantages of those methods.

SUMMARY OF THE INVENTION

An object of the present invention is to provide a circuit, semiconductor device, and function module test method which realize the shortening of the test time, in the test of a semiconductor device including a plurality of function modules having the same function.

Another object of the present invention is to provide a circuit, semiconductor device, and function module test method which realize reduction of the number of input and output pins for test, in the test of a semiconductor device including a plurality of function modules having the same function.

A feature of the present invention resides in that test inputs and/or outputs are made common, and tests of arbitrarily selected function modules are carried out simultaneously in parallel.

A function module to be tested may be decided to be passed or failed on the basis of results of comparison between a test result of arbitrary at least one function module among a plurality of function modules included in the semiconductor device and test results of other function modules.

In accordance with an aspect of the present invention, there is provided a circuit for testing a plurality of function modules having same function to be incorporated into a device, the circuit including: a test module selection circuit for receiving a test input vector via a test input terminal, and selecting, out of a plurality of the function modules, one or more function modules to be supplied with the test input vector according to an input selection signal; a synchronous input circuit for receiving the test input vector from the test module selection circuit, and supplying the test input vector synchronously to the function modules selected by the test module selection circuit; an output module selection circuit for receiving test results outputted as a sequel of tests carried out simultaneously in parallel in the function modules supplied with the test input vector by the synchronous input circuit, and selecting one or more test results out of the outputted test results according to an output selection signal; and a comparison circuit for receiving one or more test results of tests carried out in the function modules selected by the test module selection circuit, comparing selected test result selected by said output module selection circuit with other test results, and outputting a result of the comparison via a comparison result output terminal.

The test input terminal may be one in number.

The synchronous input circuit preferably supplies the test input vector to the selected function modules so as to conduct tests of the function modules simultaneously in parallel, finish the test simultaneously, and output test results simultaneously.

The comparison result output terminal may be one in number.

The comparison circuit may give a decision of coincidence provided that all test results inputted thereto coincide with each other.

The output module selection circuit may include a test result hold circuit for holding tests results outputted from the function modules, and the comparison circuit may give the decision by using the test results held in the test result hold circuit.

The comparison circuit may output results of pass/fail decisions respectively for one or more test results of tests executed in the selected function modules, via a plurality of comparison result output terminals, respectively.

The selected test result may be judged to be passed or not by an external IC tester.

The IC tester compares successively test results of tests carried out in selected function modules with a prescribed expected value, and supplies the test results to the comparison circuit.

In accordance with another aspect of the present invention, there is provided a method of testing a plurality of function modules having same function to be incorporated into a device, the method comprising the steps of: (a) receiving one test input vector, and selecting, out of a plurality of the function modules, one or more function modules to be supplied with the test input vector according to an input selection signal; (b) receiving the test input vector, and supplying the test input vector synchronously to the selected function modules; (c) receiving test results outputted as a sequel of tests carried out simultaneously in parallel in the function modules supplied with the test input vector, and selecting, out of the outputted test results, one or more test according to an output selection signal; and (d) receiving one or more test results of tests carried out in the function modules selected in the step (a), comparing selected test result selected in the step (c) with other test results, and outputting one or more comparison results.

In accordance with another aspect of the present invention, there is provided a semiconductor device incorporating a circuit for testing a plurality of function modules having same function to be incorporated into the device, the semiconductor device including: a test module selection circuit for receiving a test input vector via a test input terminal, and selecting, out of a plurality of the function modules, one or more function modules to be supplied with the test input vector according to an input selection signal; a synchronous input circuit for receiving the test input vector from the test module selection circuit, and supplying the test input vector synchronously to the function modules selected by the test module selection circuit; an output module selection circuit for receiving test results outputted as a sequel of tests carried out simultaneously in parallel in the function modules supplied with the test input vector by the synchronous input circuit, and selecting one or more test results out of the outputted test results according to an output selection signal; and a comparison circuit for receiving one or more test results of tests carried out in the function modules selected by the test module selection circuit, comparing selected test result selected by the output module selection circuit with other test results, and outputting at least one result of the comparison via a comparison result output terminal.

Other features and advantages of the present invention will become apparent from the following description taken in conjunction with the accompanying drawings.

BRIEF DESCRIPTION OF DRAWINGS

The accompanying drawings, which are incorporated in and constitute apart of the specification, illustrate presently preferred embodiments of the invention, and together with the general description given above and the detailed description of the preferred embodiments given below, served to explain the principles of the invention.

DETAILED DESCRIPTION OF THE PREFERRED EMBODIMENTS

Hereafter, embodiments of a circuit, semiconductor device, and method for enhancing the test efficiency of function modules according to the present invention will be described in detail by referring to FIGS. 2 to 6.

First Embodiment

Hereafter, a circuit, semiconductor device, and function module test method according to a first embodiment of the present invention will be described in detail by referring to FIG. 2 and FIG. 3. In a semiconductor device including a plurality of function modules having the same function, the first embodiment provides a function of conducting tests of a plurality of function modules simultaneously in parallel and outputting a test result of the semiconductor device as a whole (a plurality of function modules as a whole).

Figure 1:
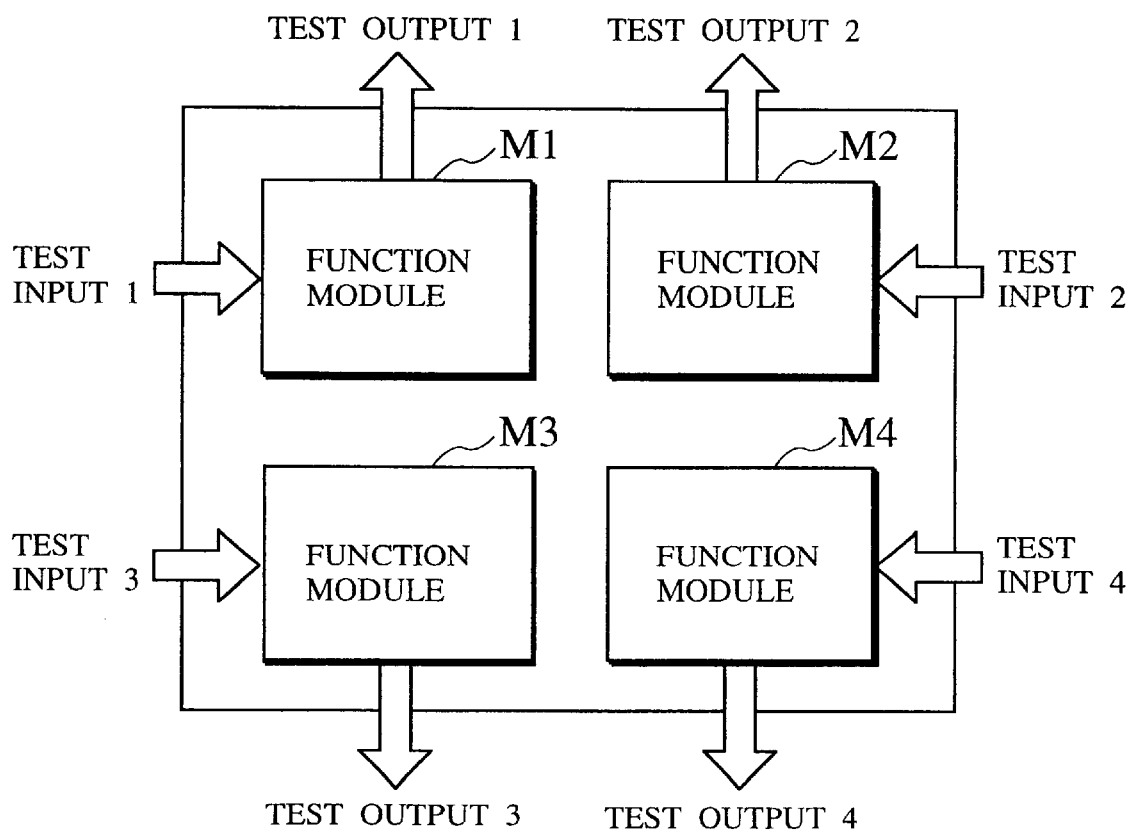
FIG. 1 is a diagram showing a test form for testing a plurality of function modules having the same function included in a conventional semiconductor device.
Figure 2:
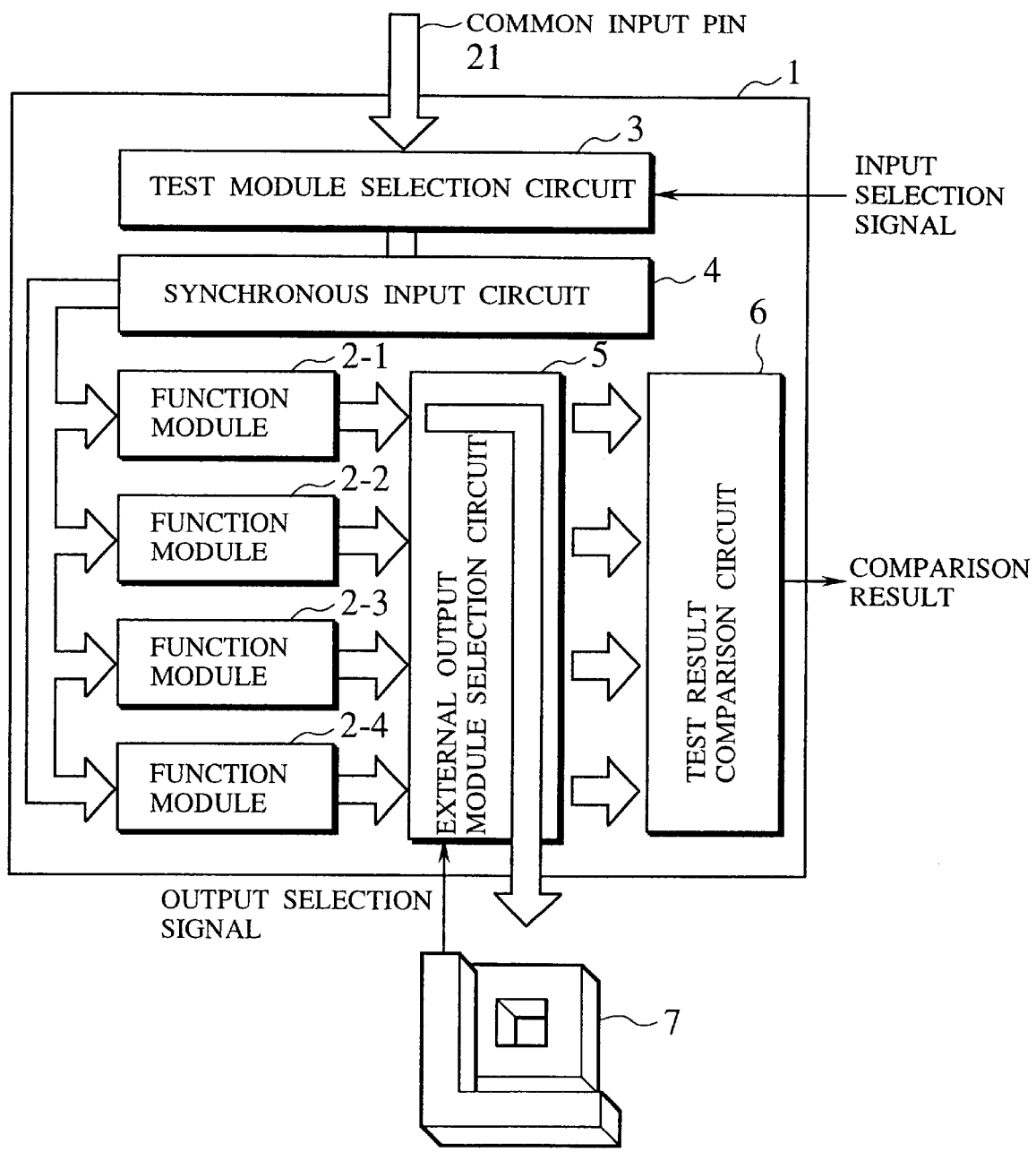
FIG. 2 is a block diagram showing the configuration of a semiconductor device according to a first embodiment of the present invention.
Figure 3:
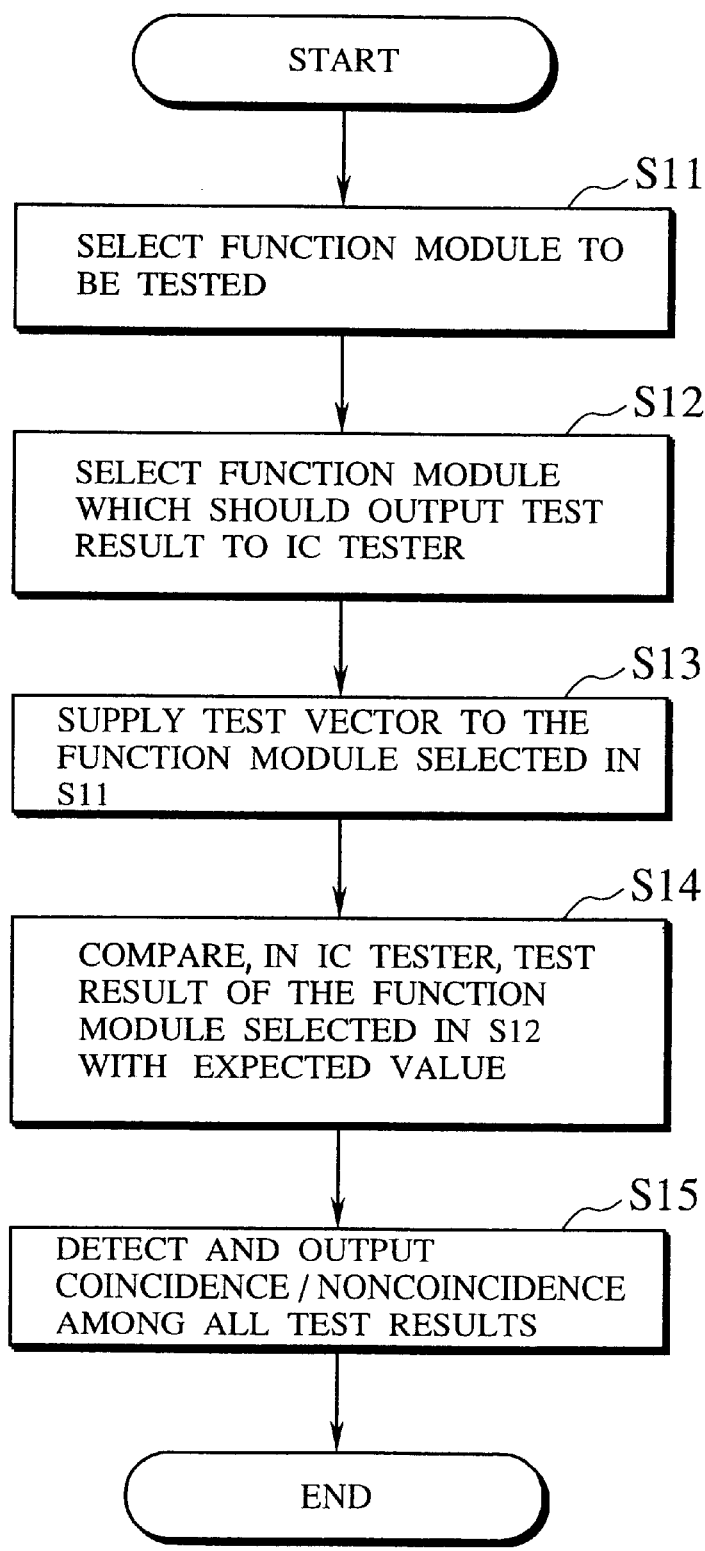
FIG. 3 is a flow chart showing a test procedure of a plurality of function modules according to the first embodiment of the present invention.

FIG. 2 is a block diagram showing the configuration of a semiconductor device according to a first embodiment of the present invention.

In the semiconductor device according to the first embodiment, tests of function modules, such as CPUs, 2-1 to 2-4 having the same function included in the semiconductor device 1 are carried out simultaneously in parallel and the function modules 2-1 to 2-4 are judged to be good or no good, as shown in FIG. 2. It is now assumed that in the first embodiment the result of "good" means that all of the four function modules 2-1 to 2-4 have passed the tests and the result of "no good" means that at least one of the four function modules 2-1 to 2-4 has failed in test. The semiconductor device according to the first embodiment comprises a test module selection circuit 3, a synchronous input circuit 4, an external output module selection circuit 5, and a test result comparison circuit 6. The test module selection circuit 3, the synchronous input circuit 4, the external output module selection circuit 5, and the test result comparison circuit 6 are included within the semiconductor device 1.

Inputs to the function modules 2-1 to 2-4 are supplied from a common input pin via the test module selection circuit 3 and the synchronous in put circuit 4. The test module selection circuit 3 selects function modules 2-1 to 2-4 to be supplied with the input from the input pin. The selection of the function modules 2-1 to 2-4 is ordered from the outside by an input selection signal supplied from an input module selection pin. It is now assumed that the number of selected modules is n. Upon receiving an order from the test module selection circuit 3, the synchronous input circuit 4 supplies synchronized inputs to n selected function modules. In the case where n>1, synchronization is conducted. In the case where n=1, however, synchronization is not conducted because it is not necessary. Outputs corresponding to the synchronized inputs are outputted from the function modules 2-1 to 2-4 at the same timing, and supplied to the test result comparison circuit 6 via the external output module selection circuit 5.

The external output module selection circuit 5 selects at least one of a plurality of function modules 2-1 to 2-4, and outputs the output data from the selected function module 2-1 to 2-4 from an output pin of the semiconductor device 1. The output pin is connected to an IC tester 7.

In FIG. 2, an example in which the function module 2-1 has been selected is shown. However, any one of the function modules 2-1 to 2-4 may be selected. The selection of the function modules 2-1 to 2-4 is ordered from the outside by an output selection signal supplied to an output module selection pin. In the case where n>1, the order of the output selection signal is obeyed. In the case where n=1, however, the order of the input selection signal is obeyed as it is. The reason is that when n=1 only that function module is tested and consequently there are no outputs from other function modules. The test result comparison circuit 6 detects coincidence/noncoincidence of outputs of a plurality of function modules 2-1 to 2-4, and outputs its result via a comparison result output pin of the semiconductor device 1. Since only coincidence/ noncoincidence is judged, the comparison result output pin is formed of one pin in the first embodiment. In the case where n>1, comparison is conducted. In the case where n=1, however, nothing is conducted. The reason is that when n=1 only that function module is tested and consequently comparison is not needed.

Operation of the first embodiment in the above described configuration will now be described by referring to a flowchart of FIG. 3.

First, function modules 2-1 to 2-4 to be simultaneously tested are selected (step S11). Here, it is assumed that the input module selection circuit 3 is ordered by the input selection signal to test all of the function modules 2-1 to 2-4 simultaneously. The number of function modules to be tested simultaneously may be freely set. Furthermore, one of function modules 2-1 to 2-4 which should output a test result to the IC tester 7 via the output pin is selected (step S12). Here, it is assumed that the output module selection circuit 5 is ordered to select the function module 2-1 by the output selection signal supplied from the outside via the output module selection pin. While the function module 2-1 is selected here, any function module may be selected.

Subsequently, a test vector (a test input pattern) is supplied to the input pin (step S13). By the synchronous input circuit 4, the test vector is supplied to the function modules 2-1 to 2-4 selected by the test module selection circuit 3. And in the function modules 2-1 to 2-4, tests are conducted simultaneously in parallel. Test results are outputted from the function modules 2-1 to 2-4 to the external output module selection circuit 5 at the same timing, and supplied to the test result comparison circuit 6 via the external output module selection circuit 5. In accordance with an order given from the external output module selection circuit 5, the output of the function module 2-1 is also outputted from the output pin as well. The test result outputted from the output pin is compared with its expected value by the IC tester 7. Pass/fail of the function module 2-1 is thus judged (step S14). In the test result comparison circuit 6, coincidence/ noncoincidence of the test results of all of the function modules 2-1 to 2-4 is detected. The comparison result is outputted from the comparison result output pin (step S15).

A good/no good decision on a plurality of function modules 2-1 to 2-4 is given, for example, as hereafter described. If "pass" is outputted from the IC tester 7 and "coincidence" is outputted from the comparison result output pin, then the operation of the function modules 2-1 to 2-4 is judged to be normal, i.e., the function modules 2-1 to 2-4 are judged to be components of an excellent article. On the other hand, if one or both of the above described conditions is not satisfied, some or all of operations of the function modules 2-1 to 2-4 are judged to be abnormal, i.e., defective.

By using the first embodiment, effects described hereafter are obtained.

In the semiconductor device according to the first embodiment, tests of a plurality of same function modules 2-1 to 2-4 are processed simultaneously in parallel. As a result, the test time is significantly shortened. In addition, by making the input pins and the output pins common, both the pin number reduction and the package size reduction of the semiconductor device 1 can be achieved simultaneously. In keeping therewith, the number of test vectors can be reduced to (1/the number of function modules) as compared with the conventional technique.

Furthermore, comparison of the test results is processed in the semiconductor device 1 in a hardware manner. Therefore, a test management program for controlling and managing a test sequence need only refer to the decision result of the IC tester 7 and the output of the comparison result output pin. As a result, the test can be facilitated. If in this test result even one of a plurality of same function modules 2-1 to 2-4 fails in test, then the semiconductor device 1 is regarded as a defective article. Therefore, test time shortening can be realized, in such a test that the whole semiconductor device 1 is handled as a defective article provided that even one of the function modules 2-1 to 2-4 is defective, such as a test in mass production. The first embodiment is very effective.

Second Embodiment

Next, a semiconductor device and a function module test method according to a second embodiment will now be described in detail by referring to FIGS. 4 and 5. In the semiconductor device including a plurality of function modules having the same function, the second embodiment provides a function of conducting tests of a plurality of function modules simultaneously in parallel, giving decisions individually on respective function modules as to whether they are good or no good, and outputting test results.

Figure 4:
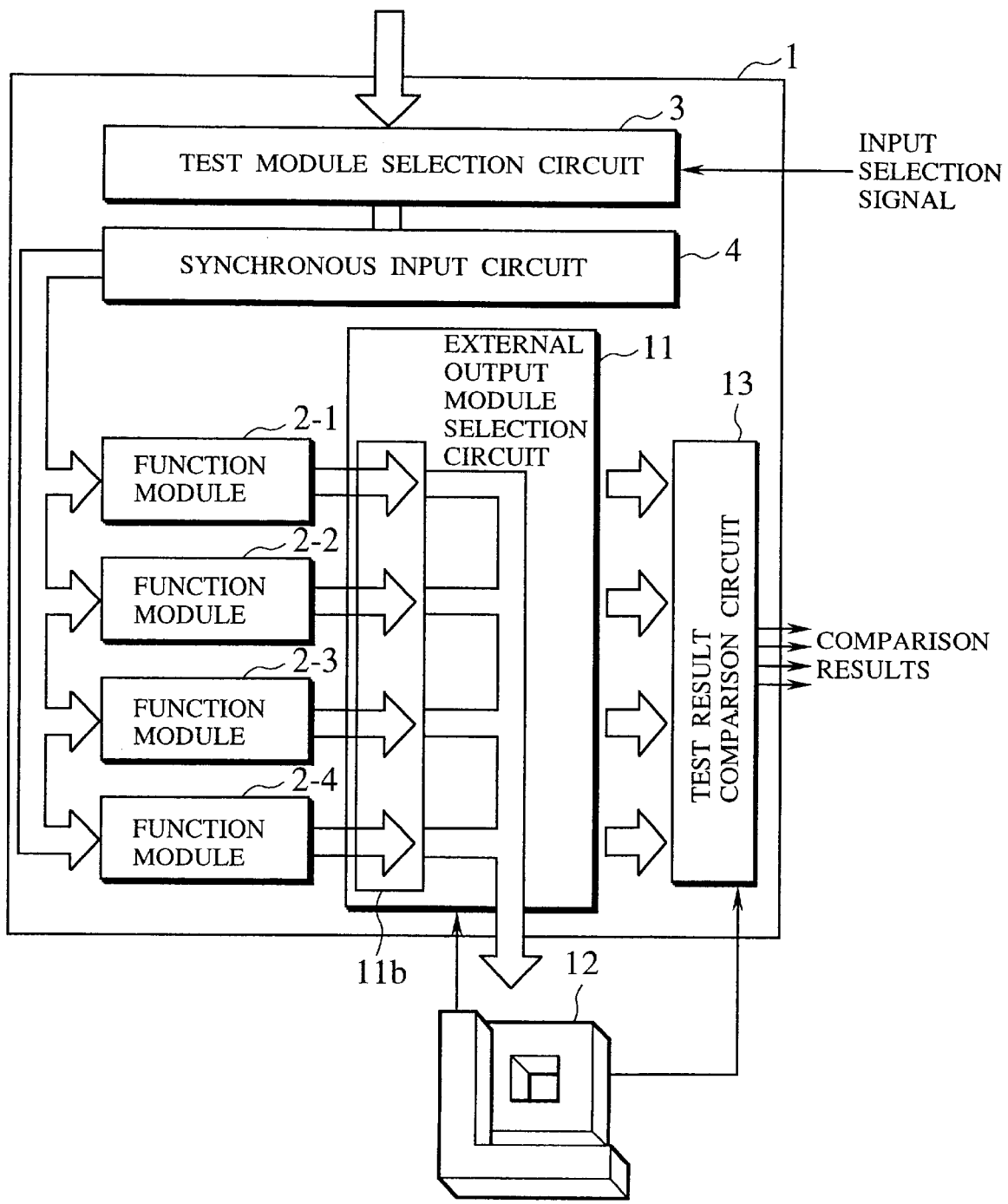
FIG. 4 is a block diagram showing the configuration of a semiconductor device according to a second embodiment of the present invention.
Figure 5:
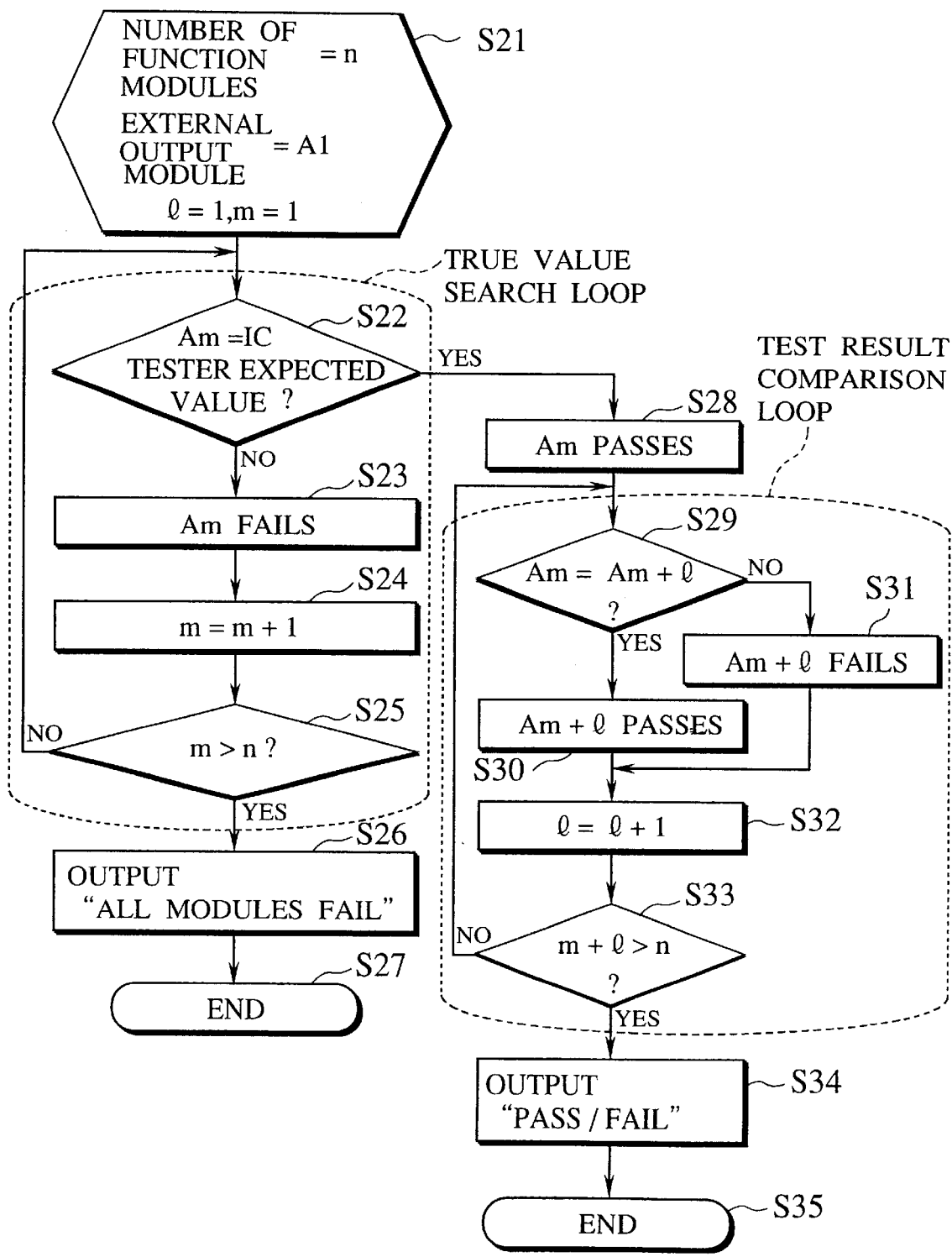
FIG. 5 is a flow chart showing a test procedure in the semiconductor device shown in FIG. 4.

FIG. 4 is a block diagram showing the configuration of a semiconductor device according to a second embodiment of the present invention.

As compared with the first embodiment, the second embodiment is formed to give decisions independently on respective function modules 2-1 to 2-4 as to whether they are good or no good. Except this point, the second embodiment is the same as the embodiment shown in FIG. 2. Components denoted by the same numerals as those of FIG. 2 have like functions, and description thereof will be omitted.

In order to realize the above described feature, the second embodiment is different from the first embodiment in configurations of the external output module selection circuit 11, the IC tester 12, and the test result comparison circuit 13.

The external output module selection circuit 11 includes a hold circuit 11b for receiving and holding results of tests conducted simultaneously in parallel on the function modules 2-1 to 2-4 supplied with a test input by the synchronous input circuit 4. The test results held in the hold circuit 11b are selectively outputted to the IC tester 12 in accordance with an output selection signal supplied from the IC tester 12.

The IC tester 12 supplies the output selection signal to the external output module selection circuit 11, and starts a pass/fail decision on the results of the tests conducted in the function modules 2-1 to 2-4 selectively outputted from the external output module selection circuit 11 in accordance with the output selection signal. When the IC tester 12 first gives a pass decision on the test results, the IC tester 12 finishes the pass/fail decision operation, outputs the pass/fail decision results to the test result comparison circuit 13, and controls the comparison decision operation of the test result comparison circuit 13.

Upon receiving the test results held in the hold circuit 11b incorporated in the external output module selection circuit 11, the test result comparison circuit 13 compares test results decided to be passed by the IC tester 12 with test results which have not yet been subjected to the pass/fail decision under the control by IC tester 12, and thereby gives a coincidence/noncoincidence decision. The test result comparison circuit 13 outputs the decision results and the pass/fail decision result in the IC tester 12 via four comparison result output pins respectively provided for the function modules 2-1 to 2-4.

Operation of the semiconductor device according to the second embodiment having the above described configuration will now be described by referring to a flow chart shown in FIG. 5.

Operation conducted until the test results of the function modules 2-1 to 2-4 are supplied to the external output module selection circuit 11 is the same as that of the first embodiment, and description thereof will be omitted. First, initialization is conducted before the operation of the flow chart shown in FIG. 3 is carried out (step S21). More particularly, in this initialization, the number of function modules to be selected is set ton in the same way as the first embodiment. For example, n=4 is set here. Furthermore, a function module name selected by the external output module selection circuit 11 is defined as A (module number). In addition, variables l=1 and m=1 are set.

Subsequently, a true value search loop formed of steps S22 to S24 is carried out. Between the external output module selection circuit 11 and the IC tester 12, function modules 2-1 to 2-4 passing the test are searched for successively. In other words, a test result of the function module 2-1 is first supplied to the IC tester 12 and compared with an expected value, and a pass/fail decision is given (step S22). If the decision is "fail" (step S23), the next function module 2-2 becomes the subject of the comparison decision (step S24). In the same way as the foregoing description, the pass/fail decision is given successively. If the comparison decision on all of the four function modules 2-1 to 2-4 is finished and all of the four function modules 2-1 to 2-4 are decided to be "fail", then notice signal that all of the four function modules 2-1 to 2-4 are defective is given to the test result comparison circuit 13 by the IC tester 12, and outputted from the test result comparison circuit 13 via respectively corresponding comparison result output pins. The comparison decision operation is finished (steps S26 and S27).

On the other hand, a passed function module is detected in the above described true value search loop (step S28). At that time point, the true value search loop is finished. A test result comparison loop formed of steps S29 to S33 is carried out. A pass/fail decision on function modules which have not yet been. subjected to pass/fail decision is given within the semiconductor device 1. In other words, the test result of the passed function module is compared with the test result of a function module which has not yet been subjected to the pass/fail decision (step S29). In the case of coincidence, the function module is decided to be "pass" (step S30). In the case of noncoincidence, the function module is decided to be "fail" (step S31). These operations are conducted successively for the function modules which have not yet been subjected to the pass/fail decision (step S32). If the above described operations are conducted on all of the function modules which have not yet been subjected to the decision on test results (step S33), pass/fail decision results of respective function modules are outputted from the test result comparison circuit 13 via respectively corresponding comparison result output pins. The comparison decision operation is finished (steps S34 and S35).

Besides the effects similar to those of the first embodiment, the second embodiment provides the following effects In the semiconductor device of the first embodiment, nothing but the good/no good decision can be given as the test result of a plurality of same function modules 2-1 to 2-4. In the test circuit of the second embodiment, a good/no good decision can be given on each of the function modules 2-1 to 2-4. In other words, the second embodiment brings about an effect, in the case where it is desirable to regard such a semiconductor device that some of a plurality of same function modules 2-1 to 2-4 passes the test as an excellent article, or in the case where it is desirable to conduct a more detailed test than the first embodiment on the semiconductor device 1.

Third Embodiment

Next, a semiconductor device and a function module test method according to a third embodiment of the present invention will be described in detail by referring to FIG. 6. In a semiconductor device having the same configuration as that of the first embodiment, the third embodiment makes possible such an operation as to test a plurality of function modules individually.

Figure 6:
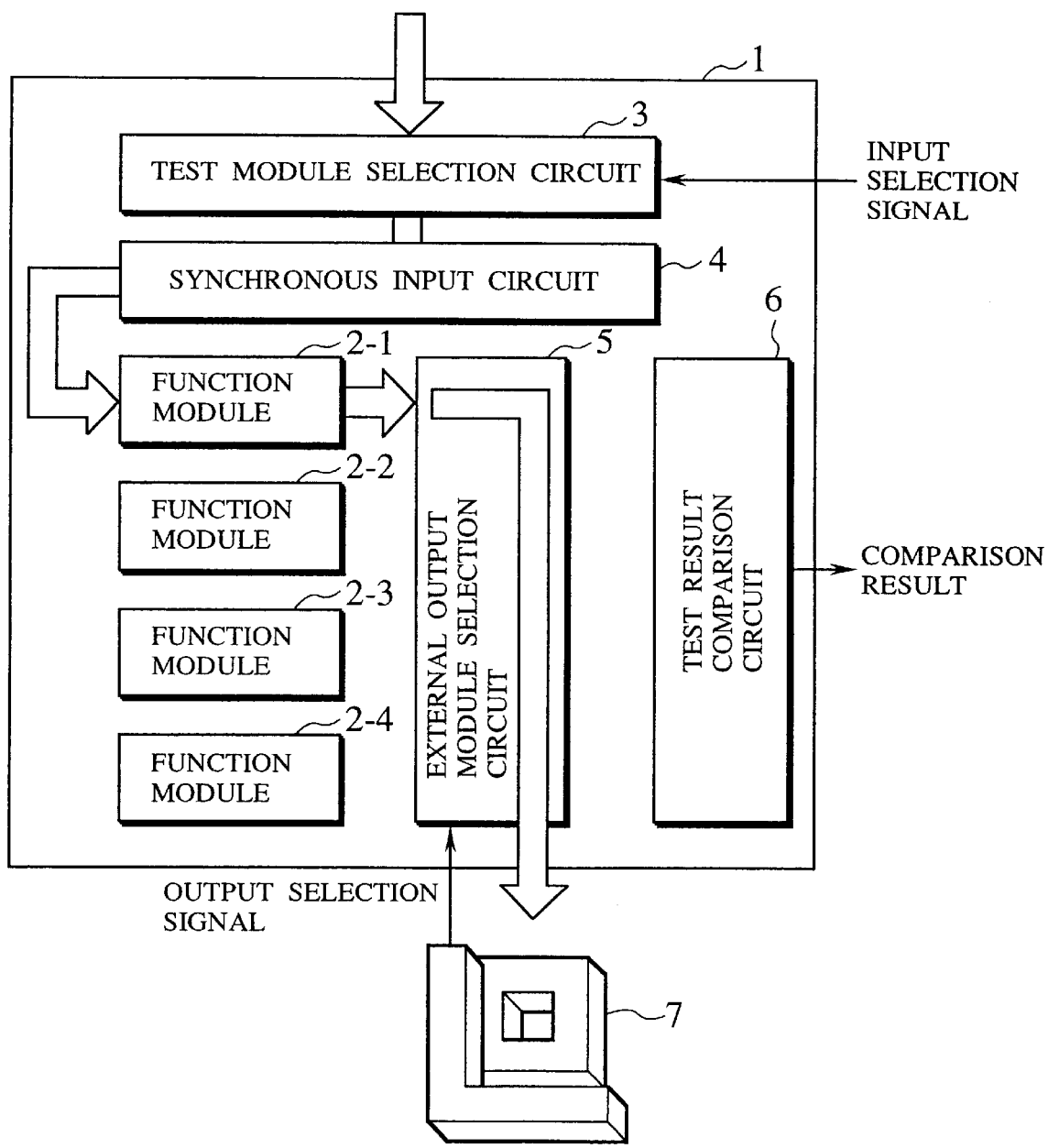
FIG. 6 is a block diagram showing the configuration of a semiconductor device according to a third embodiment of the present invention.

FIG. 6 is a block diagram showing the configuration of a semiconductor device according to the third embodiment of the present invention.

The semiconductor device according to the third embodiment is the same as that of the first embodiment.

In the operation of the semiconductor device according to the third embodiment, a test module selection circuit 3 is notified of one of the function modules 2-1 to 2-4 to be tested, by an input selection signal via an input module selection pin. Here, the case where the function module 2-1 has been selected is shown. Representing the number of selected function modules by an in the same way as the above described embodiments, it follows that n=1. A test vector is supplied to an input pin. Since n=1, the test vector is passed through the synchronous input circuit 4 and inputted to the function module 2-1. If a test result is outputted from the function module 2-1, then the test result is passed through an external module selection circuit 5 as it is, and outputted to the outside from an output pin, because n=1. A test result comparison circuit 6 is not activated. The test result outputted from the output pin is compared with an expected value in an IC tester 7. A pass/fail decision is thus given.

The third embodiment brings about the following effects.

In the same way as the above described embodiments, the input and output pins are made common in the test of a plurality of same function modules 2-1 to 2-4. Therefore, reduction of the number of pins and the package size of the semiconductor device 1 can be realized. Furthermore, although the present invention aims at simultaneously testing a plurality of same function modules 2-1 to 2-4, the third embodiment is formed so as to be able to test each of a plurality of function modules 2-1 to 2-4. As a result, the third embodiment is effective in the case where it is desirable to conduct a test according to a stage, such as development, evaluation, and defect analysis of the semiconductor device 1.

In summary, according to the present invention, the test input and the test output of a plurality of function modules having the same function are made common, and tests of respective function modules are conducted simultaneously in parallel. Owing to adoption of such a configuration, the test time can be shortened, and reduction of the number of pins and the package size can be realized. In addition, reduction of the test input patterns (test vectors) and shortening and facilitation of the test management program can be realized. Furthermore, these advantages can bring about greater effects as the number and scale of the same function modules become large.

Furthermore, since a function module supplied with the test input can be arbitrarily selected, it becomes possible to test each function module individually. As a result, the semiconductor device and method can be used for tests of various purposes such as development, evaluation, or defect analysis.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A circuit for testing a plurality of function modules having same function to be incorporated into a device, said circuit comprising:
    a test module selection circuit for receiving a test input vector via a test input terminal, and selecting, out of a plurality of said function modules, one or more function modules to be supplied with the test input vector according to an input selection signal;
    a synchronous input circuit for receiving said test input vector from said test module selection circuit, and supplying said test input vector synchronously to the function modules selected by said test module selection circuit;
    an output module selection circuit for receiving test results outputted as a sequel of tests carried out simultaneously in parallel in said function modules supplied with said test input vector by said synchronous input circuit, and selecting one or more test results out of said outputted test results according to an output selection signal; and
    a comparison circuit for receiving one or more test results of tests carried out in the function modules selected by said test module selection circuit, comparing selected test result selected by said output module selection circuit with other test results, and outputting at least one result of a comparison via a comparison result output terminal.

2. The circuit according to claim 1, wherein said test input terminal is one in number.

3. The circuit according to claim 1, wherein
said synchronous input circuit supplies the test input vector to said selected function modules so as to conduct tests of said function modules simultaneously in parallel, finish the test simultaneously, and output test results simultaneously.

4. The circuit according to claim 1, wherein
said comparison result output terminal is one in number.

5. The circuit according to claim 4, wherein
said comparison circuit gives a decision of coincidence provided that all test results inputted thereto coincide with each other.

6. The circuit according to claim 1, wherein
said output module selection circuit includes a test result hold circuit for holding tests results outputted from the function modules, and
said comparison circuit gives said decision by using the test results held in said test result hold circuit.

7. The circuit according to claim 1, wherein
said comparison circuit outputs results of pass/fail decisions respectively for one or more test results of tests carried out in said selected function modules, via a plurality of comparison result output terminals, respectively.

8. The circuit according to claim 1, wherein
said selected test result is judged to be passed or not by an external IC tester.

9. The circuit according to claim 8, wherein
said IC tester compares successively test results of tests carried out in said selected function modules with a prescribed expected value, and supplies said test results to said comparison circuit.

10. A method of testing a plurality of function modules having same function to be incorporated into a device, said method comprising the steps of:
    (a) receiving one test input vector, and selecting, out of a plurality of said function modules, one or more function modules to be supplied with the test input vector according to an input selection signal;
    (b) receiving said test input vector, and supplying said test input vector synchronously to said selected function modules;
    (c) receiving test results outputted as a sequel of tests carried out simultaneously in parallel in said function modules supplied with said test input vector, and selecting, out of said outputted test results, one or more test results according to an output selection signal; and
    (d) receiving one or more test results of tests executed in the function modules selected in said step (a), comparing selected test result selected in step (c) with other test results, and outputting one or more comparison results.

11. The method according to claim 10, wherein in said step (d) said decision results corresponding to said one or more test results are simultaneously outputted.

12. The method according to claim 10, further comprising the step of:
    (e) comparing said test result selected in said step (c) with a prescribed expected value, and thereby giving a decision as to whether a function module corresponding to said selected test result passes or fails.

13. A semiconductor device incorporating a circuit for testing a plurality of function modules having same function to be incorporated into the device, said semiconductor device comprising:

a test module selection circuit for receiving a test input vector via a test input terminal, and selecting, out of a plurality of said function modules, one or more function modules to be supplied with the test input vector according to an input selection signal;

a synchronous input circuit for receiving said test input vector from said test module selection circuit, and supplying said test input vector synchronously to the function modules selected by said test module selection circuit;

an output module selection circuit for receiving test results outputted as a sequel of tests carried out simultaneously in parallel in said function modules supplied with said test input vector by said synchronous input circuit, and selecting one or more test results out of said outputted test results according to an output selection signal; and a comparison circuit for receiving one or more test results of tests carried out in the function modules selected by said test module selection circuit, comparing selected test result selected by said output module selection circuit with other test results, and outputting at least one result of the comparison via a comparison result output terminal.

14. The device according to claim 13, wherein said synchronous input circuit supplies the test input vector to said selected function modules so as to conduct tests of said function modules simultaneously in parallel, finish the test simultaneously, and output test results simultaneously.

15. The device according to claim 13, wherein said comparison result output terminal is one in number.

16. The device according to claim 15, wherein said comparison circuit gives a decision of coincidence provided that all test results inputted thereto coincide with each other.

17. The device according to claim 13, wherein said output module selection circuit includes a test result hold circuit for holding tests results outputted from the function modules, and said comparison circuit gives said decision by using the test results held in said test result hold circuit.

18. The device according to claim 13, wherein said comparison circuit outputs results of pass/fail decisions respectively for one or more test results of tests carried out in said selected function modules, via a plurality of comparison result output terminals, respectively.

19. The device according to claim 13, wherein said selected test result is judged to be passed or not by an external IC tester.

20. The device according to claim 19, wherein said IC tester compares successively test results of tests carried out in said selected function modules with a prescribed expected value, and supplies said test results to said comparison circuit.

* * * * *